(12) United States Patent
Liu et al.

(10) Patent No.: US 12,550,276 B2
(45) Date of Patent: Feb. 10, 2026

(54) CONNECTOR AND POWER APPARATUS CASE SHELL

(71) Applicant: Sungrow Power Supply Co., Ltd., Hefei (CN)

(72) Inventors: Long Liu, Hefei (CN); Xiangyang Ren, Hefei (CN); Wenhao Li, Hefei (CN); Yonghong Li, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 196 days.

(21) Appl. No.: 18/288,224

(22) PCT Filed: Feb. 16, 2022

(86) PCT No.: PCT/CN2022/076423
§ 371 (c)(1),
(2) Date: Oct. 25, 2023

(87) PCT Pub. No.: WO2022/252691
PCT Pub. Date: Dec. 8, 2022

(65) Prior Publication Data
US 2024/0244766 A1    Jul. 18, 2024

(30) Foreign Application Priority Data

Jun. 1, 2021    (CN) .......................... 202110610095.9

(51) Int. Cl.
*H05K 5/00*    (2025.01)
*H05K 5/02*    (2006.01)
(Continued)

(52) U.S. Cl.
CPC ............. *H05K 5/15* (2025.01); *H05K 5/0217* (2013.01); *H05K 5/03* (2013.01)

(58) Field of Classification Search
CPC ........ H01H 9/042; H02B 1/28; H02B 13/025; H05K 5/0217; H05K 5/03; H05K 5/15; H05K 5/00; H05K 5/02; H05K 7/1432
(Continued)

(56) References Cited

U.S. PATENT DOCUMENTS 4,628,392 A    12/1986    Didier

FOREIGN PATENT DOCUMENTS

| CN | 101791191 A | 8/2010 |
|---|---|---|
| CN | 205140856 U | 4/2016 |

(Continued)

OTHER PUBLICATIONS

International Search Report and Written Opinion for International Application No. PCT/CN2022/076423, mailed Apr. 24, 2022.
(Continued)

*Primary Examiner* — Timothy J Thompson
*Assistant Examiner* — Guillermo J Egoavil
(74) *Attorney, Agent, or Firm* — Wolf, Greenfield & Sacks, P.C.

(57) ABSTRACT

A connector for a case shell of a power apparatus includes a main body member. Two ends of the main body member are respectively connected to different members of the case shell, and the main body member is deformable; and the main body member is used to deform when an explosion occurs inside the case shell and the different members of the case shell connected by means of the main body member are disengaged from each other. The main body member of the connector can deform when devices inside the case shell explode and the different members of the case shell connected by means of the main body member are disengaged from each other, such that two members of the case shell connected by means of the main body member are slightly disengaged from each other to form a gap.

14 Claims, 7 Drawing Sheets

(51) Int. Cl.
*H05K 5/03* (2006.01)
*H05K 5/15* (2025.01)

(58) Field of Classification Search
USPC .......................................................... 174/50
See application file for complete search history.

(56) References Cited

FOREIGN PATENT DOCUMENTS

| | | | |
|---|---|---|---|
| CN | 106340603 A | 1/2017 | |
| CN | 206023029 U | 3/2017 | |
| CN | 108123382 A | 6/2018 | |
| CN | 111109992 A | 5/2020 | |
| CN | 211137519 U | 7/2020 | |
| CN | 211209077 U | 8/2020 | |
| CN | 211860789 U | * 11/2020 | ........... H05K 7/1432 |
| CN | 212336108 U | 1/2021 | |
| CN | 212543384 U | 2/2021 | |
| CN | 213017933 U | 4/2021 | |
| CN | 112787239 A | 5/2021 | |
| CN | 113224684 A | 8/2021 | |
| DE | 200 04 034 U1 | 5/2000 | |
| JP | H07-025544 U | 5/1995 | |
| JP | H09-180597 A | 7/1997 | |
| JP | 2001-023481 A | 1/2001 | |
| JP | 2010-238459 A | 10/2010 | |
| JP | 2019-016557 A | 1/2019 | |

OTHER PUBLICATIONS

Extended European Search Report for European Application No. 22814740.1, dated May 7, 2025.

* cited by examiner

CONNECTOR AND POWER APPARATUS CASE SHELL

This application is a national stage filing under 35 U.S.C. § 371 of International Patent Application Serial No. PCT/CN2022/076423, filed Feb. 16, 2022, which claims priority to Chinese Patent Application No. 202110610095.9, titled "CONNECTOR AND ELECTRIC POWER APPARATUS CASE SHELL", filed on Jun. 1, 2021 with the China National Intellectual Property Administration. The contents of these applications are incorporated herein by reference in their entireties.

FIELD

The present application relates to the technical field of mechanical industry, and in particular to a connector and an electric power apparatus case shell.

BACKGROUND

With the development of electric power industry, the power level of electric power apparatus such as an inverter is increasing. When a device, such as a capacitor, a switch, a relay and a battery module, inside electric power apparatus explodes due to a fault (such as a short circuit of a busbar capacitor) in the electric power apparatus, the explosion energy is large, so that components such as a shell cover in a case shell of the electric power apparatus could be blown away, and the safety of other equipment and personnel on site is affected.

Therefore, how to solve the problem that explosion of the device inside the electric power apparatus in the conventional technology will cause the components of the case shell to be blown away and affect the safety of other equipment and personnel on site, is an urgent problem to be solved by those skilled in the art.

SUMMARY

A connector is provided according to the present application, a main body of the connector is deformable when a device inside a case shell explodes and different components of the case shell break away from each other, so that the two components, which are in the case shell and connected to each other by the main body, slightly break away from each other to form a gap, which releases the explosion pressure inside the case shell, allows the two components of the case shell to be always connected to each other, prevents components of the case shell and objects inside the case shell from being blown out, and ensures the safety of equipment and personnel on site. An electric power apparatus case shell using the connector is also provided according to the present application, which can prevent the explosion of the device inside the case shell from affecting the safety of other equipment and personnel on site.

To achieve the above objectives, the present application provides the following technical solutions.

A connector for a case shell of an electric power apparatus includes: a main body and an end connector,
two ends of the main body are connected to different components of the case shell, and the main body is deformable; and the main body deforms when an explosion occurs inside the case shell and the different components of the case shell break away from each other; and
the number of the end connector is at least one; and the end connector is connected to an end of the main body, and the end connector is connected to one of the different components of the case shell.

In an embodiment, in the connector, the end of the main body is connected to the component of the case shell through the end connector fixedly connected to the end of the main body.

In an embodiment, in the connector, the end, fixedly connected to the end connector, of the main body is directly and fixedly connected to the component of the case shell.

In an embodiment, in the connector, the end connector and the main body are of an integrated structure, or the end connector and the main body are separately arranged.

In an embodiment, in the connector, the end connector is a metal end connector.

In an embodiment, in the connector, the main body is U-shaped, or at least part of the main body is folded into a serpentine shape, or at least part of the main body is spiral.

In an embodiment, in the connector, the main body includes at least two straight rods, the at least two straight rods are sequentially connected, and ends of any two adjacent straight rods are hinged to each other.

In an embodiment, in the connector, in all of the at least two straight rods, an end, which is facing away from an adjacent straight rod, of a straight rod located at one end, is hinged to the end connector, and the end connector is fixed to the component; an end, which is facing away from an adjacent straight rod, of a straight rod located at the other end, is hinged to the other one of the different components.

An electric power apparatus case shell includes a first component and a second component fixed to each other, and further includes the connector described above; and the two ends of the main body are respectively connected to the first component and the second component.

In an embodiment, in the electric power apparatus case shell, the first component is a shell cover, and the second component is a shell body.

The connector for a case shell of an electric power apparatus is provided according to the present application. The connector includes a main body and at least one end connector. The two ends of the main body are respectively configured to be connected to the different components of the case shell, and the main body is deformable. The main body is configured to deform when an explosion occurs inside the case shell and the different components, which are in the case shell and connected to each other through the main body, break away from each other. The end connector is connected to the end of the main body, and the end connector is connected to the component of the case shell.

In the connector according to the present application, the main body is configured to deform when the device inside the case shell explodes and the different components, which are in the case shell and connected to each other through the main body, break away from each other, so that the two components, which are in the case shell and connected to each other, slightly break away from each other to form a gap, which releases the explosion pressure inside the case shell, and the two components of the case shell are always connected to each other through the main body, which prevents components of the case shell and objects inside the case shell from being blown out, and ensures the safety of equipment and personnel around on site.

An electric power apparatus case shell using the connector described above is also provided according to the present application, which can prevent the explosion of the device inside the case shell from harming the safety of other equipment and personnel on site.

BRIEF DESCRIPTION OF THE DRAWINGS

In order to more clearly illustrate the technical solutions in the embodiments of the present application or in the conventional technology, the following will briefly introduce drawings required in the description of the embodiments or the conventional technology. Apparently, the drawings in the following description are only some embodiments of the present application. For those skilled in the art, other drawings can also be obtained based on the drawings without creative efforts.

The reference signs in FIGS. 1 to 9 are listed as follows: connector 100; main body 101; straight rod 111; end connector 102, 121, 122; shell cover 201; and shell body 202.

DETAILED DESCRIPTION OF EMBODIMENTS

A connector is disclosed according to the embodiments of the present application. A main body of the connector is configured to deform when a device inside a case shell explodes and different components of the case shell break away from each other, so that the two components, which are in the case shell and connected to each other by the main body, slightly break away from each other to form a gap, which releases the explosion pressure inside the case shell, allows the two components of the case shell to be always connected to each other, prevents components of the case shell and objects inside the case shell from being blown out, and ensures the safety of equipment and personnel on site. An electric power apparatus case shell using the connector is also provided according to the embodiments of the present application, which can prevent affecting the safety of other equipment and personnel on site when the explosion of the device inside the case shell occurs.

The technical solutions in the embodiments of the present application are clearly and completely described below in conjunction with the drawings. Apparently, the described embodiments are only part of the embodiments of the present application, not all of the embodiments of the present application. Any other embodiment obtained by those skilled in the art based on the embodiments in the present application without creative efforts shall fall within the protection scope of the present application.

Referring to FIGS. 1 to 9, a connector 100 is provided according to the embodiments of the present application, which is applied to a case shell of an electric power apparatus. The connector 100 includes a main body 101. Two ends of the main body 101 are respectively connected to different components of the case shell, and the main body 101 is deformable. The main body 101 deforms when an explosion occurs inside the case shell and the different components, which are in the case shell and connected to each other by the main body 101, break away from each other.

In the connector 100 according to the embodiments of the present application, the main body 101 deforms when a device inside the case shell explodes and the different components, which are in the case shell and connected to each other by the main body 101, break away from each other, so that the two components, which are in the case shell and connected to each other by the main body 101, slightly break away from each other to form a gap, which releases the explosion pressure inside the case shell, allows the two components of the case shell to be always connected to each other, prevents components of the case shell and objects inside the case shell from being blown out, and ensures the safety of equipment and personnel on site.

In addition, in the connector 100 according to the embodiments of the present application, the main body 101 deforms under the action of a force, and a buffering can be achieved through the deformation of the main body 101 when the connector 100 is applied to the case shell, which greatly reduces explosion stress and further improves safety.

In an embodiment, the connector 100 further includes at least one end connector, the at least one end connector is connected to an end of the main body 101, and the at least one end connector is connected to the different components of the case shell. The end of the main body 101 connected to a same end connector is connected to the component of the case shell.

Furthermore, in the connector 100, the end of the main body 101 may be connected to the component of the case shell through the end connector fixedly connected to the end of the main body. The end, fixedly connected to the end connector, of the main body 101 may be directly and fixedly connected to the component of the case shell, and the end connector can enhance the connection strength between the end of the main body and the component of the case shell.

The number of the end connector can be set as one, corresponding to which one end of the main body 101 is fixedly connected to the end connector, and the other end of the main body 101 is directly connected to the component of the case shell; multiple end connectors (such as two) can also be provided, and the multiple end connectors are distributed at both ends of the main body 101.

In addition, the end connector and the main body 101 may be of an integrated structure, or the end connector and the main body 101 may be separately arranged, and specifically, the end connector may be connected to the end of the main body 101 by a fixing member such as a bolt, or connected to the end of the main body 101 by means of welding or the like.

In order to ensure the connection strength between the end connector and the component in the case shell, the end connector is preferably a metal end connector, and alternatively, the end connector may also be a high-strength fiber member or the like. The material of the end connector is not limited in the embodiments.

In a solution where no end connector is provided for the connector, two ends of the main body 101 may be directly connected to different components of the case shell. Specifically, the two ends of the main body 101 may be fixedly connected to the different components in the case shell or movably connected to the different components in the case shell, or one end of the main body 101 is fixedly connected to one of the different components in the case shell and the other end of the main body 101 is movably connected to the other of the different components in the case shell. The direct connection manner between the main body and the components is not limited in the embodiments.

Figure 1:
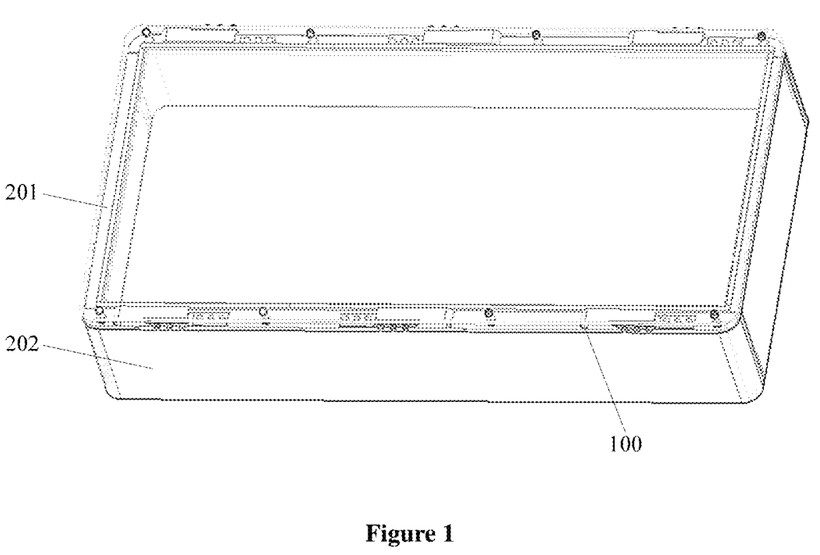
FIG. 1 is a schematic diagram of applying a connector to an electric power apparatus case shell according to Embodiment 1 of the present application.
Figure 2:
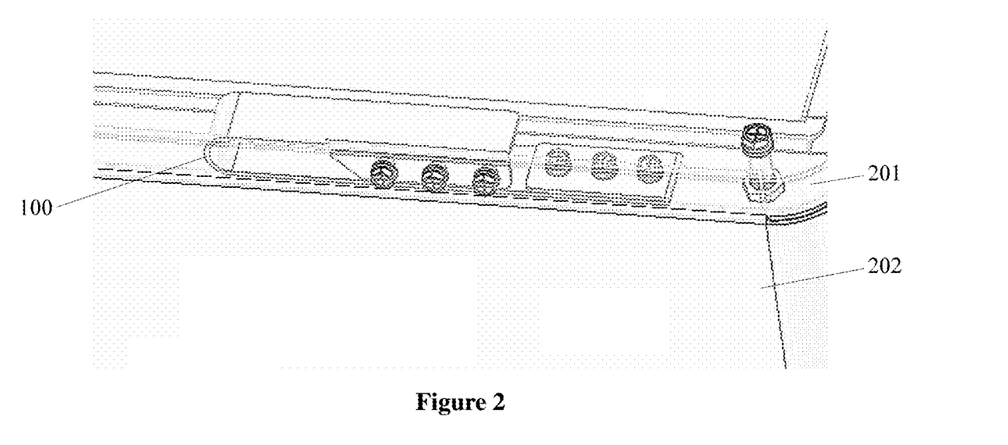
FIG. 2 is an assembly diagram of the connector in FIG. 1.
Figure 3:
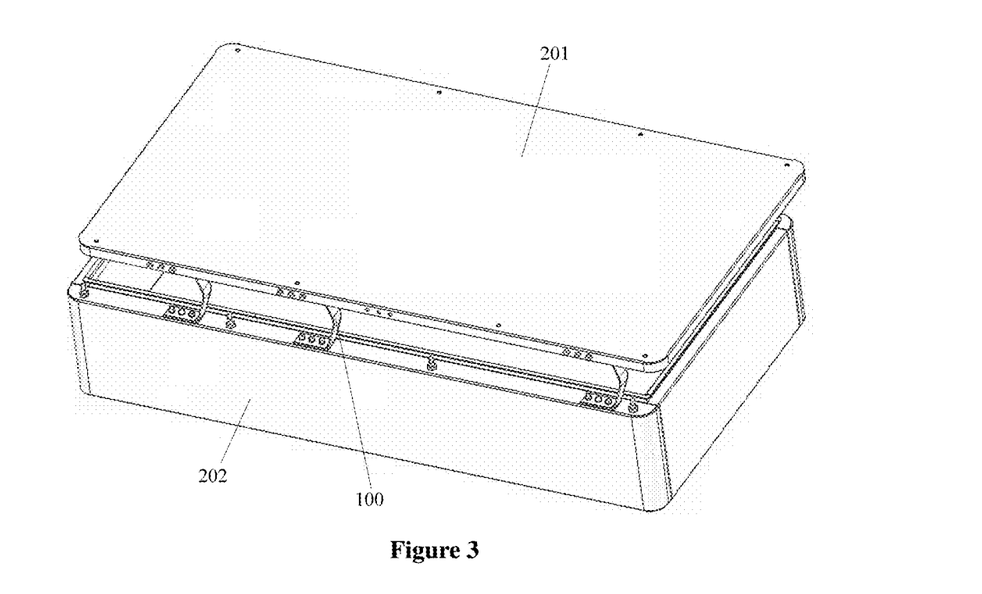
FIG. 3 is a schematic structural diagram of an electric power apparatus case shell according to Embodiment 1 of the present application when a device inside the electric power apparatus case shell explodes.
Figure 4:
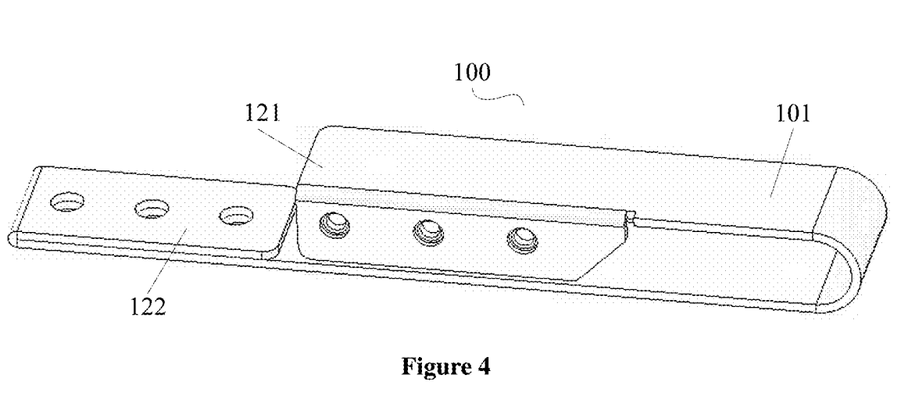
FIG. 4 is a schematic structural diagram of the connector according to Embodiment 1 of the present application.
Figure 5:
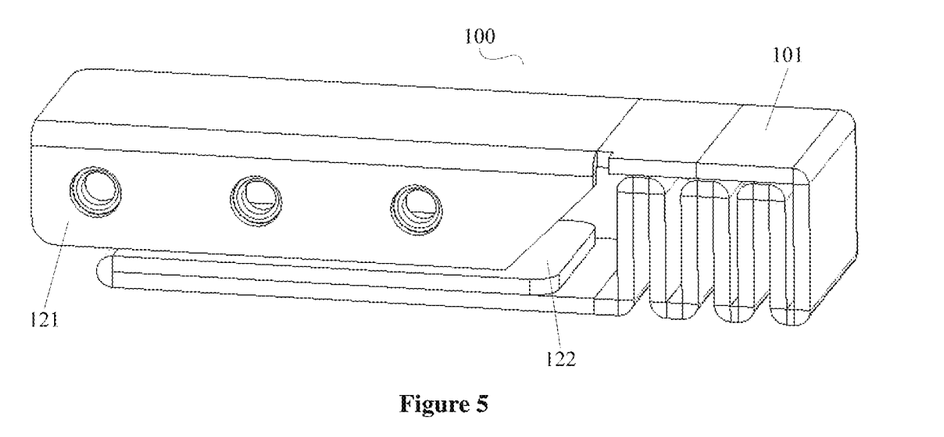
FIG. 5 is a schematic structural diagram of a connector according to Embodiment 2 of the present application.
Figure 6:
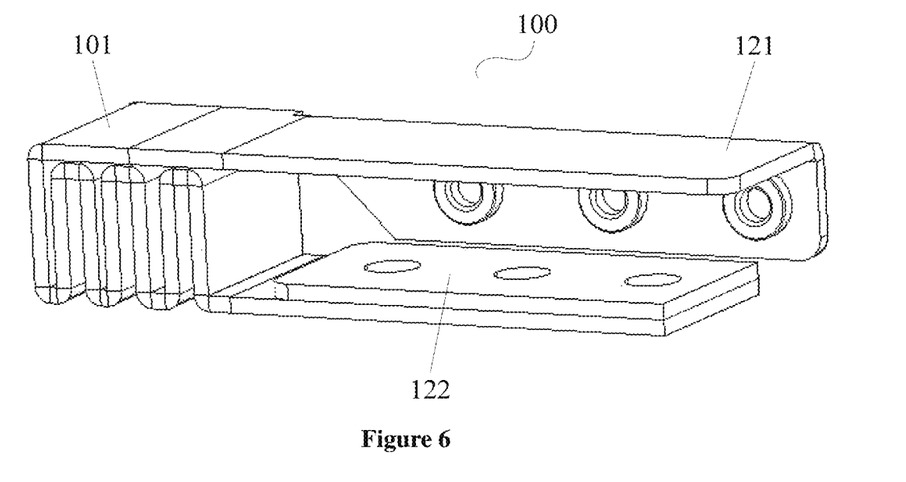
FIG. 6 is a view of the connector shown in FIG. 5 from another angle.

In order to facilitate deformation, the main body 101 may be U-shaped (as shown in FIGS. 1 to 4), or at least part of the main body 101 may be folded into a serpentine shape (as shown in FIGS. 5 to 6), or at least part of the main body 101 may be spiral, so that the main body 101 deforms and is unfolded when an explosion occurs inside the case shell and the two components connected by the connector break away from each other.

In the connector, the main body 101 may be a rubber main body, a high-strength fiber main body or the like for facilitating deformation. The material of the main body 101 is not limited in the embodiments.

The main body 101 may include at least two straight rods 111, the at least two straight rods 111 are sequentially connected, and ends of any two adjacent straight rods 111 are hinged to each other.

Figure 7:
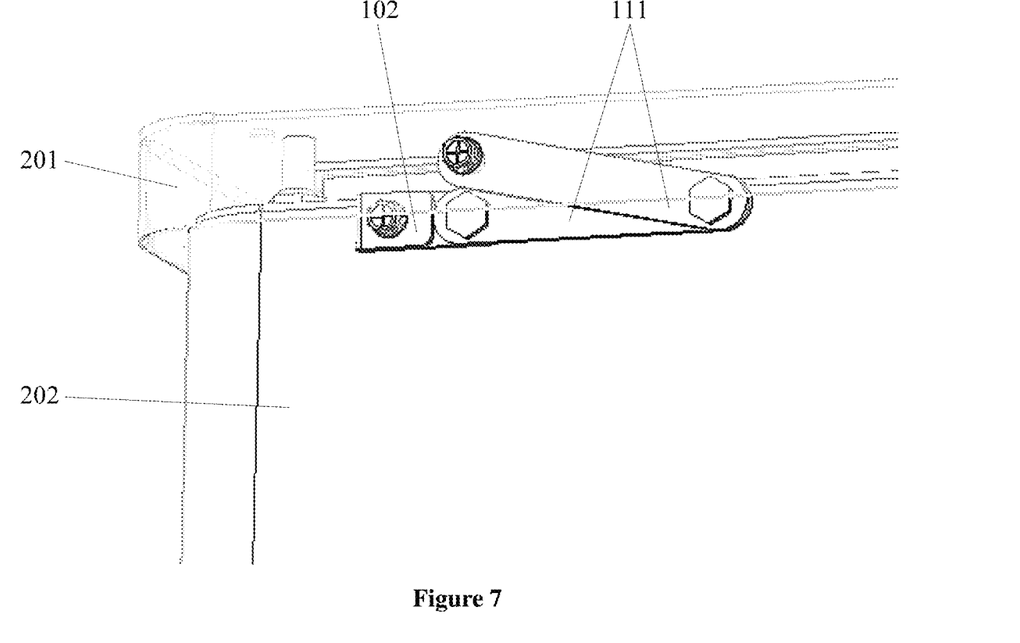
FIG. 7 is a schematic diagram of applying a connector to an electric power apparatus case shell according to Embodiment 3 of the present application.
Figure 8:
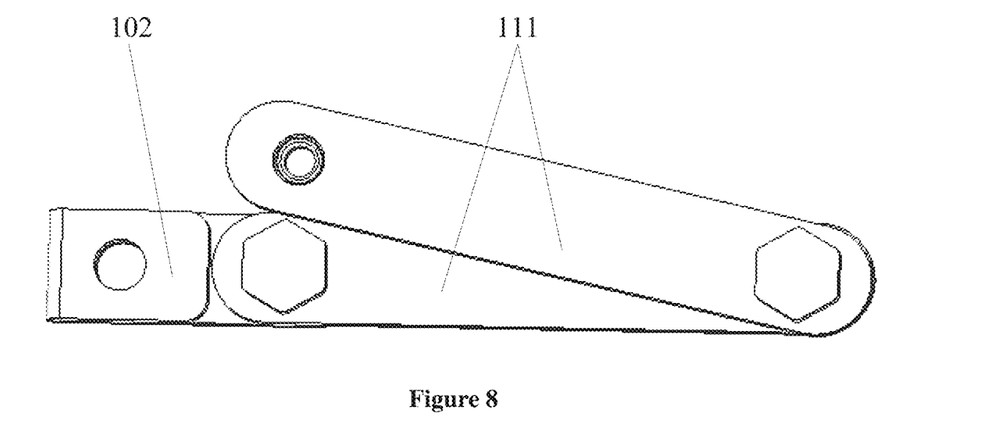
FIG. 8 is a schematic structural diagram of a connector according to Embodiment 3 of the present application.
Figure 9:
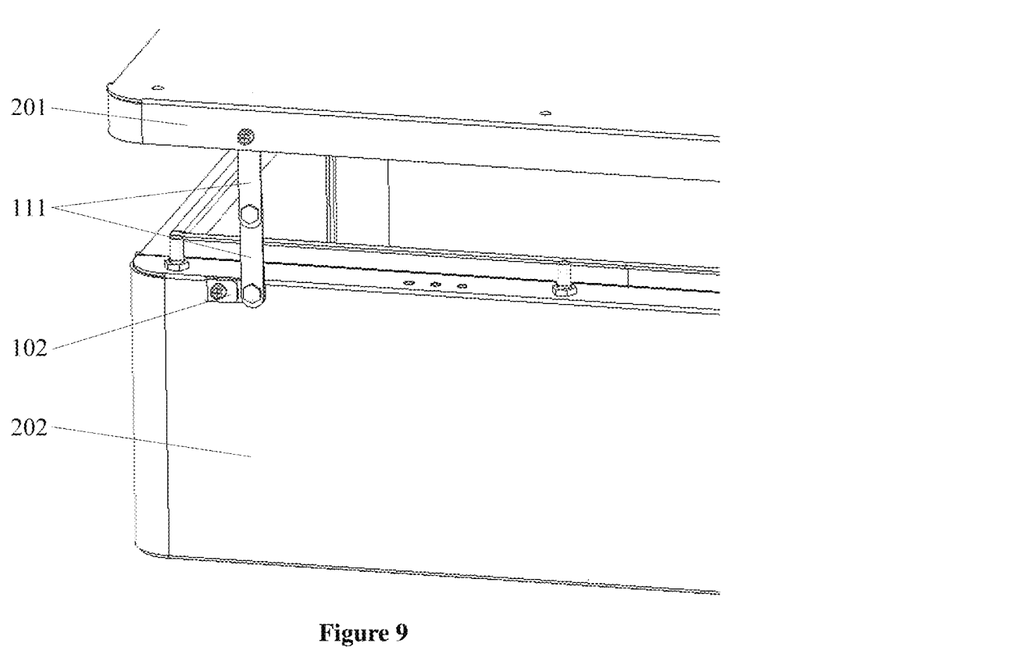
FIG. 9 is a schematic structural diagram of an electric power apparatus case shell according to Embodiment 3 of the present application when a device inside the electric power apparatus case shell explodes.

Specifically, in the connector 100, among all of the at least two straight rods 111, an end, facing away from an adjacent straight rod 111, of a straight rod 111 located at one end, is hinged to the end connector, and the end connector is fixed to the component. An end, facing away from an adjacent straight rod 111, of a straight rod 111 located at the other end, is hinged to the other one of the different components, as shown in FIGS. 7 to 9.

The main body 101 of the connector 100 is arranged inside a space enclosed by the two components in the case shell. In a solution where an end connector is provided, the end connector is also arranged inside the space enclosed by the two components in the case shell, so as to achieve hidden installation and reduce the impact on the appearance of the case shell.

The connector 100 according to the embodiments has a simple structure, is easy to produce and manufacture, and has a low cost. Compared with measures that such as increases the strength of components in the case shell in the conventional technology, the connector 100 according to the embodiments of the present application can ensure pressure relief and has better explosion-proof effect.

The following describes the connector 100 according to the embodiments of the present application with reference to the accompanying drawings:

Embodiment 1

Referring to FIGS. 1 to 4, a connector 100 according to the embodiment of the present application includes a main body 101 and end connectors. A first end of the main body 101 is fixed to a component of the case shell through the end connector 121, and specifically, fixed to the component by a fixing member such as a bolt or welding. A second end of the main body 101 is directly and fixedly connected to the other one of the end connectors 121 of the case shell. In order to improve the connection strength, the second end of the main body 101 is also fixedly connected to the end connector 122.

The second end of the main body 101 may be directly and fixedly connected to the end connector 122 (by bonding and so on), or the second end may overlap the end connector 122 and fixedly connected to the component of the case shell through the fixing member, which improves the connection strength between the second end and the component, and simplifies the mounting structure of the end connector 122.

The main body 101 is U-shaped and can be unfolded when an explosion occurs inside the case shell, which buffers the explosion stress, ensures the two components of the case shell to be reliably connected through the main body 101, and ensures the main body 101 to have a simple structure for facilitating production and manufacture.

The component connected to the end connector 121 includes an annular side wall and a top wall sealed at one end of the side wall. The end connector 121 is connected in a space enclosed by the side wall and the top wall, and specifically, the end connector 121 may be connected to the side wall or the top wall, which is not limited in the embodiment.

Specifically, the component connected to the end connector 121 is a shell cover 201. The end connectors 121 and 122 are metal connectors, and the main body 101 may be a rubber main body or a high-strength fiber main body.

Embodiment 2

Referring to FIGS. 5 to 6, a connector 100 according to the embodiment includes a main body 101. End connectors 121, 122 differ from the end connectors in Embodiment 1 in that part of the main body 101 is folded into a serpentine shape.

Embodiment 3

Referring to FIGS. 7 to 9, a connector 100 according to the embodiment includes a main body 101 and an end connector 102. The main body 101 includes two straight rods 111 whose ends are hinged to each other. An end, facing away from a second straight rod, of a first straight rod is hinged to the end connector 102. An end, facing away from the second straight rod, of the second straight rod is hinged to a component of a case shell (for example, a shell cover 201), and the end connector 102 is fixedly connected to another component of the case shell (for example, a shell body 202).

In the embodiment, the straight rods 111 are metal straight rods, and the end connector 102 is a metal end connector.

An electric power apparatus case shell is provided according to the embodiment of the present application, which includes a first component and a second component fixed to each other. The electric power apparatus case shell further includes the connector 100 according to the above embodiments. Two ends of the main body 101 are respectively connected to the first component and the second component.

Specifically, the first component is a shell cover 201, and the second component is a shell body 202. According to the specific structure of the case shell, the first component may also be a window seal, which is not limited in the embodiment.

The electric power apparatus case shell according to the embodiment applies the connector 100 according to the above embodiments, which can prevent the explosion of an internal device from harming the safety of other equipment and personnel on site. The electric power apparatus case shell according to the embodiment also has other effects of the connector 100 according to the above embodiments, which is not repeated here.

The embodiments in this specification are described in a progressive manner, and each embodiment focuses on the differences from other embodiments. Same and similar parts of each embodiment can be referred to each other.

The above description of the embodiments is provided to enable those skilled in the art to implement or use the present application. Various modifications to the embodiments are apparent to those skilled in the art. General principles defined herein may be implemented in other embodiments without departing from spirits or scopes of the present application. Therefore, the present application is not limited to the embodiments shown herein, but is to be accorded the widest scope consistent with the principles and novel features disclosed herein.

The invention claimed is:

1. A connector for a case shell of an electric power apparatus comprises:
    a main body, wherein two ends of the main body are respectively configured to be connected to different components of the case shell, and the main body is deformable; and the main body deforms when an explosion occurs inside the case shell and the different components of the case shell break away from each other; and
    an end connector, wherein the number of the end connector is at least one; and the end connector is connected to an end of the main body, and the end connector is connected to one of the different components of the case shell; wherein
    the main body is U-shaped; or
    at least part of the main body is folded into a serpentine shape; or
    at least part of the main body is spiral; or
    the main body comprises at least two straight rods, the at least two straight rods are sequentially connected, and ends of any two adjacent straight rods are hinged to each other.

2. The connector according to claim 1, wherein the end of the main body is connected to the component of the case shell through the end connector fixedly connected to the end of the main body.

3. The connector according to claim 2, wherein the end, fixedly connected to the end connector, of the main body is directly and fixedly connected to the component of the case shell.

4. The connector according to claim 2, wherein the end connector and the main body are of an integrated structure, or the end connector and the main body are separately arranged.

5. The connector according to claim 4, wherein the end connector is a metal end connector.

6. The connector according to claim 1, wherein among all of the at least two straight rods, an end, which is facing away from an adjacent straight rod, of a straight rod located at one end, is hinged to the end connector, and the end connector is fixed to the component; an end, which is facing away from an adjacent straight rod, of a straight rod located at the other end, is hinged to the other one of the different components.

7. A electric power apparatus case shell, comprising a first component and a second component fixed to each other, and further comprising the connector according to claim 1; wherein the two ends of the main body are respectively connected to the first component and the second component.

8. The electric power apparatus case shell according to claim 7, wherein the first component is a shell cover-201, and the second component is a shell body.

9. The connector according to claim 3, wherein the end connector and the main body are of an integrated structure, or the end connector and the main body are separately arranged.

10. A electric power apparatus case shell, comprising a first component and a second component fixed to each other, and further comprising the connector according to claim 2; wherein the two ends of the main body are respectively connected to the first component and the second component.

11. A electric power apparatus case shell, comprising a first component and a second component fixed to each other, and further comprising the connector according to claim 3; wherein the two ends of the main body are respectively connected to the first component and the second component.

12. A electric power apparatus case shell, comprising a first component and a second component fixed to each other, and further comprising the connector according to claim 4; wherein the two ends of the main body are respectively connected to the first component and the second component.

13. A electric power apparatus case shell, comprising a first component and a second component fixed to each other, and further comprising the connector according to claim 5; wherein the two ends of the main body are respectively connected to the first component and the second component.

14. A electric power apparatus case shell, comprising a first component and a second component fixed to each other, and further comprising the connector according to claim 6; wherein the two ends of the main body are respectively connected to the first component and the second component.

* * * * *